(12) United States Patent
He et al.

(10) Patent No.: US 6,656,535 B2
(45) Date of Patent: Dec. 2, 2003

(54) METHOD OF FABRICATING A COATED PROCESS CHAMBER COMPONENT

(75) Inventors: Yongxiang He, Sunnyvale, CA (US); Hong Wang, Cupertino, CA (US); Clifford Stow, Santa Clara, CA (US)

(73) Assignee: Applied Materials, Inc, Santa Clara, CA (US)

( * ) Notice: Subject to any disclaimer, the term of this patent is extended or adjusted under 35 U.S.C. 154(b) by 0 days.

(21) Appl. No.: 10/032,387

(22) Filed: Dec. 21, 2001

(65) Prior Publication Data

US 2003/0118731 A1 Jun. 26, 2003

(51) Int. Cl.[7] .............................. C23C 4/02; C23C 4/08; B05D 3/12
(52) U.S. Cl. ................... 427/449; 427/455; 427/456; 427/290; 427/292; 427/299; 427/309
(58) Field of Search ................................. 427/449, 456, 427/455, 290, 292, 299, 309

(56) References Cited

U.S. PATENT DOCUMENTS

| | | | |
|---|---|---|---|
| 3,839,234 A | * 10/1974 | Roscoe ..................... 510/435 |
| 4,076,883 A | * 2/1978 | Dittrich et al. .............. 428/387 |
| 4,491,496 A | 1/1985 | Laporte et al. |
| 4,543,265 A | * 9/1985 | Kasuya ...................... 427/453 |
| 4,717,462 A | 1/1988 | Homma et al. |
| 4,940,528 A | * 7/1990 | Oki et al. .................... 204/427 |
| 5,384,200 A | * 1/1995 | Giles et al. .................. 428/552 |
| 5,549,802 A | 8/1996 | Guo |
| 5,587,039 A | 12/1996 | Salimian et al. |
| 5,858,100 A | 1/1999 | Maeda et al. |
| 5,879,523 A | 3/1999 | Wang et al. |
| 5,903,428 A | 5/1999 | Grimard et al. |
| 5,916,378 A | 6/1999 | Bailey et al. |
| 5,953,827 A | 9/1999 | Or et al. |
| 5,976,327 A | 11/1999 | Tanaka |
| 6,015,465 A | 1/2000 | Kholodenko et al. |
| 6,051,114 A | 4/2000 | Yao et al. |
| 6,059,945 A | 5/2000 | Fu et al. |
| 6,451,181 B1 | * 9/2002 | Denning et al. ........ 204/192.17 |
| 2002/0090464 A1 | * 7/2002 | Jiang et al. ................. 427/446 |

FOREIGN PATENT DOCUMENTS

| | | |
|---|---|---|
| JP | 54 162969 | 12/1979 |
| WO | 99 17336 | 4/1999 |

OTHER PUBLICATIONS

Rosenberg, Reed W., "Increasing PVD tool uptime and particle control iwth twin–wire–arc spray coatings", MICRO Magazine, Mar. 2001, Los Angeles, CA.

"Standard Test Method for Adhesion or Cohesive Strength of Flame–Sprayed Coatings", American Society for Testing and Materials, (no date).

* cited by examiner

Primary Examiner—Katherine A. Bareford
(74) Attorney, Agent, or Firm—Ashok K. Janah

(57) ABSTRACT

A method of fabricating a process chamber component that has a ceramic form with grains and grain boundary regions. In the method, the component is bead blasted to provide a surface having a relatively low roughness average of less than about 150 microinches. The component is dipped into a solution having a concentration that is sufficiently low to reduce etching of grain boundary regions of the ceramic form. A metal coating is formed over at least a portion of the ceramic form. The component fabricated by this method can tolerate thicker deposits of sputtered material in a sputtering process without the sputtered deposit accumulates causing spalling of the coating of the component.

16 Claims, 6 Drawing Sheets

```
┌─────────────────────────────┐
│   Bead blasting a component │
│   to provide a surface roughness│
│   having a roughness average of │
│   less than about 150 micro-inches. │
└─────────────────────────────┘
              │
              ▼
┌─────────────────────────────┐
│ Dipping the ceramic form into a │
│ solution having a concentration that │
│ is sufficiently low to reduce etching │
│ of grain boundary regions of the │
│           ceramic form.     │
└─────────────────────────────┘
              │
              ▼
┌─────────────────────────────┐
│  Forming a metal coating over │
│    at least a portion of the │
│           ceramic form.      │
└─────────────────────────────┘
```

FIG. 2

METHOD OF FABRICATING A COATED PROCESS CHAMBER COMPONENT

BACKGROUND

Embodiments of the present invention relate to a method of fabricating process chamber components.

A substrate processing chamber may be used to process a substrate in an energized process gas, such as a plasma, to manufacture electronic circuits, such as integrated circuit chips and displays. Typically, the process chamber comprises an enclosure wall that encloses a process zone into which a process gas is introduced, a gas energizer to energize the process gas, and an exhaust system to exhaust and control the pressure of the process gas in the chamber. The process chamber may, for example, be used to deposit material on a substrate or to etch material from a substrate. For example, the chamber may be used to sputter deposit a material onto the substrate, such as a metal for example, aluminum, copper or tantalum; or a metal compound such as tantalum nitride or titanium nitride.

The chamber components that are exposed in the chamber, such as the surfaces of a chamber sidewall, ceiling, liner, or deposition ring, are often coated with a coating layer that, for example, may serve to enhance the adhesion of sputtered material onto the coating, to increase the erosion resistant of the underlying material to the plasma in the chamber, or to provide some other desirable property, such as have an electrically conducting surface. For example, a chamber component may be made from aluminum oxide or quartz and plasma spray coated with a coating of aluminum.

In one process for fabricating such components, a ceramic form of a component is prepared by grit blasting the component using a high-energy grit blasting step, and then dipping the component in a concentrated acid solution, such as an HF solution having a concentration of greater than 20%. The grit blasting step may be used to remove an existing coating on the component in a refurbishment process or to prepare the component surface to receive a new coating. The grit blasting steps are performed to achieve a high surface roughness average (Ra) values of greater than 200 micro inch on the component surface. It is believed that the higher roughness values provide better adhesion of the overlying coating on the ceramic form. Thereafter, the component is re-coated, in the case of a refurbishment process, or freshly coated with coating layer, in the case of a new component.

However, such conventional component fabrication methods still often result in components having an unacceptably low component part life, requiring the components to be frequently replaced or re-furbished. For example, when such chamber components are used in PVD processes to sputter deposit material onto a substrate from a target, the sputtered material also accumulates on the surfaces of the component. The accumulated deposits can cause thermal expansion stresses that result in delamination, cracking, and flaking-off of the underlying coating from the ceramic form. The plasma in the chamber can penetrate through the coating cracks or other damaged areas and erode the exposed surfaces of the chamber component, eventually leading to failure of the component.

Thus, it is desirable to have a process that is capable of fabricating a component having desirable surface properties in a substrate processing environment. It is further desirable to have a component which exhibits a good lifetime in fabrication processes in which excessive amounts of sputtered material may deposit on the component. It is also desirable to allow the component, when deteriorated in operation, to be refurbished as needed.

SUMMARY

A method of fabricating a component for a process chamber, the component comprising a ceramic form having grains and grain boundary regions, and the method comprising:

(a) bead blasting the component to provide a surface having a roughness average of less than about 150 microinches;

(b) dipping the component into an solution having a concentration of acid or base that is sufficiently low to reduce etching of grain boundary regions of the ceramic form; and (c) forming a metal coating over at least a portion of the ceramic form.

A method of fabricating a component for a process chamber, the component comprising a ceramic form having aluminum oxide grains and grain boundary regions, and the method comprising:

(a) bead blasting the component to provide a surface roughness having a roughness average of less than about 150 microinches;

(b) dipping the component into a solution comprising one or more of HF, HCl, and $HNO_3$, in a concentration of less than about 10 volume percent; and (c) forming an aluminum coating over at least a portion of the component by a twin-wire thermal spraying process.

A method of forming a component for a process chamber, the component comprising a ceramic form having aluminum oxide grains and grain boundary regions, and the method comprising:

(a) bead blasting the component to provide a surface roughness having a roughness average of less than about 150 microinches;

(b) dipping the component into a solution comprising less than about 20 volume percent of one or more of KOH or diethylene glycol monobutyl ether; and (c) forming an aluminum coating over at least a portion of the ceramic form by a twin wire thermal spraying process.

DRAWINGS

These features, aspects, and advantages of the present invention will become better understood with regard to the following description, appended claims, and accompanying drawings which illustrate examples of the invention. However, it is to be understood that each of the features can be used in the invention in general, not merely in the context of the particular drawings, and the invention includes any combination of these features, where:

FIG. 2 is a flow chart showing an embodiment of a process according to the present invention;

DESCRIPTION

Figure 1:
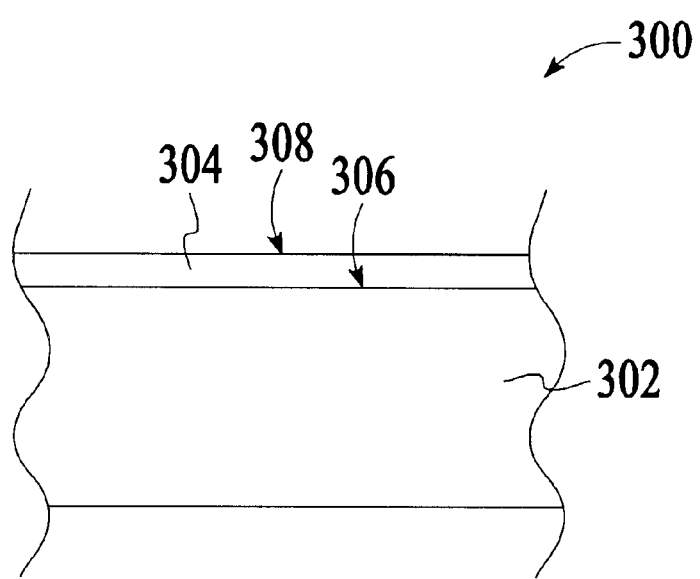
FIG. 1 is a sectional schematic side view of a chamber component having a metal coating.

The present process is used fabricate a coated component 300 for a process chamber that is capable of providing increased resistance to chemical erosion and better resistance to spalling of a coating 304 from the component 300. The process may be used to form one or more of components 300 in the chamber 36a that may be susceptible to erosion, such as for example a component 300 of a substrate support 18. In one version, a component 300 of the support 18 comprising one or more of a deposition ring 15 or cover ring 17 that are used in a deposition chamber 36a. Other chamber components 300 that may be formed comprise, for example: a part of a chamber enclosure wall 12, such as a sidewall or shield 20, a liner (not shown), or ceiling 13; a part of a gas distributor 39, such as a gas inlet 33; a portion of a gas exhaust system 28; and a part of a gas energizer 90. FIG. 1 shows a sectional view of an embodiment of a component 300 formed according to an embodiment of a method according to the present invention.

In one version, the chamber component 300 comprises a ceramic form 302 that is treated to prepare its surface and then coated with a metal coating. For example, a ceramic form 302 suitable for treatment and coating according to the present process may comprise one or more of aluminum oxide, silicon carbide, and aluminum nitride. The ceramic form 302 is treated to provide a surface 306 having characteristics that allow for enhanced bonding between the ceramic form 302 and the overlying coating 304. For example, the surface 306 of the ceramic form 302 may comprise grains and grain boundary regions that are treated, for example by removing loosely bonded or damaged grains from the surface 306, to provide a stable grain boundary region on the surface 306 that allows for the formation of a suitably strong bond between the ceramic form 302 and the overlying coating 304. Also, chemical impurities or other loose particulates may be removed from the surface 306 of the ceramic form 302 by treatment, thereby improving the adhesion of the coating 304 to the surface 306.

In an initial treatment step, the chamber component 300 is treated by bead blasting the surface 306 of the ceramic form 302. The bead blasting may be performed to remove any impurities on the surface 306 of the ceramic form 302, as well as to remove any loose or damaged grains on the surface 306 to provide a textured and roughened surface 306 that enhances the adherence of the coating 304 to the surface 306. In bead blasting, solid beads are propelled toward the surface 306 by air at a pressure that is suitably high to roughen the surface 306. The beads may comprise a material having a hardness higher than that of the ceramic form 302 to allow the beads to erode and roughen the surface 306 of the ceramic form 302 to form the roughened and textured surface 306. Suitable bead materials include for example, alumina oxide, glass, silica, or hard plastic. In one embodiment, the beads comprise a grit of aluminum oxide having a mesh size selected to suitably grit blast the surface, such as for example, a grit of alumina particles having a mesh size of 150. The bead blasting may take place in, for example, a bead blaster (not shown) comprising an enclosed housing.

It has been discovered that improved treatment of the surface 306 may be provided by a relatively gentler bead blasting process to clean and treat the surface 306 without excessively roughening of the surface 306. This discovery is unexpected, as conventional treatment processes typically employ an aggressive bead blasting process to achieve a highly roughened surface to provide improved adhesion of any overlying coating. However, it has been found that excessive roughening of the surface during the bead blasting process is in fact detrimental to the structural integrity of the coated component 300, as microcracks and damaged grain boundary regions form on the surface 306 of the ceramic form 302. A coating 304 applied to such a damaged surface 306 exhibits reduced coating adherence, as the grain boundary layer may be sufficiently damaged such that the grains at the surface of the ceramic form 302, and thus the coating 304 bonded to the surface 306, become loose, and result in the delamination or spalling of the coating 304. Also, the microcracks and damaged grain boundary layers formed during bead blasting can be exacerbated during subsequent treatment steps, such as for example wet cleaning steps.

Thus, it is desirable to maintain the bead blasting conditions to provide a less aggressive bead blasting process and hence a lower surface roughness, such as a roughness average (Ra) of less than about 150 microinches, for example from about 60 to about 140 microinches, and even less than about 120 microinches. The roughness average of the surface 306 is the mean of the absolute values of the displacements from the mean line of the peaks and valleys of the roughness features along the roughened surface 306. Suitable bead blasting conditions to provide this surface roughness may include; a pressure of the air used to propel the beads towards the surface of from about 30 psi to about 100 psi, and even from about 40 psi to about 60 psi; an angle of incidence of the beads relative to the surface of from about 45 to about 90 degrees, and even from about 75 to about 90 degrees; and a standoff distance traveled by the beads from the bead blaster to the surface of from about 4 inches to about 12 inches, and even from about 5 inches to about 8 inches.

In measuring properties of the surface 306 such as roughness average, the international standard ANSI/ASME B.46.1—1995 specifying appropriate cut-off lengths and evaluation lengths, can be used. The following Table I shows the correspondence between values of roughness average, appropriate cut-off length, and minimum and typical evaluation length as defined by this standard:

TABLE I

| Roughness Average | Cut-off Length | Min. Evaluation Length | Typ. Evaluation Length |
| --- | --- | --- | --- |
| 0 to 0.8 microinches | 0.003 inches | 0.016 inches | 0.016 inches |
| 0.8 to 4 microinches | 0.010 inches | 0.050 inches | 0.050 inches |
| 4 to 80 microinches | 0.030 inches | 0.160 inches | 0.160 inches |
| 80 to 400 microinches | 0.100 inches | 0.300 inches | 0.500 inches |
| 400 microinches and above | 0.300 inches | 0.900 inches | 1.600 inches |

The roughness average may be measured by a profilometer that passes a needle over the surface 306 and generates a trace of the fluctuations of the height of the asperities on the surface 306, or by a scanning electron microscope that uses an electron beam reflected from the surface 306 to generate an image of the surface 306.

Once the surface 306 of the ceramic form 302 has been treated by bead blasting, the surface 306 may be further treated in a second treatment step by dipping or immersing the surface 306 in a treatment solution. The treatment solution comprises a treatment agent that removes impurities from the surface 306 or cleans the surface 306 of loose grains formed during the bead blasting process, to prepare the surface 306 for bonding to the coating 304. The surface 306 may be treated by dipping into the solution for a duration of time suitable to prepare the surface 306, for example for a duration of from about 15 seconds to about 30 minutes, and even from about 15 seconds to about 15 minutes.

It has been found that unexpectedly good adhesion of the coating 304 to the ceramic form 302 can be obtained with a treatment solution comprising a sufficiently low concentration of the treatment agent to reduce etching of grain boundary regions of the ceramic form 302. This result is unexpected because conventional processes often use a higher concentration of a treatment agent to clean and prepare the surface 306, such as for example a concentration of greater than 20 volume percent of hydrofluoric acid, with the expectation that the higher concentration of the treatment agent will provide a more thorough cleaning of surface debris and contaminants. However, it has been found that a treatment solution having a concentration of the treatment agent that is sufficiently low for cleaning any residues or weakly bonded grains from the surface 306 without excessively etching grain boundary regions and without forming or exacerbating microcracks in the surface 306 of the component 300, is better. By reducing the etching damage done to the grain boundary regions on the surface 306, a treatment solution comprising a low concentration of treatment agent provides better improved bonding between the coating 304 and ceramic form 302 over conventional processes with higher concentrations.

In one version, the ceramic form 302 is dipped in an acidic treatment solution comprising a suitably low concentration of an acidic agent comprising hydrofluoric acid (HF). For example, the treatment solution may comprise a treatment agent consisting essentially of HF. The hydrofluoric acid provides good cleaning of the surface 306 and is capable of removing impurities and loose particles on the surface 306, such as particles formed during bead blasting or during processing of a substrate 16. Hydrofluoric acid can also react with, and dissolve, impurities that may have accumulated on the surface 306 of the ceramic form 302, such as $SiO_2$, CaO or MgO. A suitably low concentration of the hydrofluoric acid may be, for example, less than about 10 volume percent, for example, a concentration of from about 1 volume percent to about 10 volume percent, and even less than about 5 volume percent.

In another version, the ceramic form 302 is dipped in a solution comprising a suitably low concentration of a non-fluorinated acidic treatment agent. The non-fluorinated agent may provide a less aggressive treatment solution, which allows for the cleaning and preparation of the surface with reduced propagation of microcracks through the surface 306 of the ceramic form 302 and reduced damage to the grain boundary regions. A suitable non-fluorinated cleaning agent may comprise, for example, HCl or $HNO_3$. A suitably low concentration of the non-fluorinated agent may be a concentration of less than about 20 volume percent, for example, a concentration of from about 1 to about 20 volume percent, and even less than about 10 volume percent. In yet another version, the ceramic form is dipped in a basic solution such as a KOH solution, or a solution of an organic etchant such as diethylene glycol monobutyl ether.

Once the ceramic form 302 has been treated by dipping in the solution, a metal coating 304 is formed over at least a portion of the ceramic form 302. The coating 304 may comprise one or more metals that have substantial resistance to erosion in the substrate processing chamber 36a, such as for example, one or more of aluminum, titanium, copper and chromium. The metal coating 304 is formed to protect the ceramic form 302 from corrosion, for example by an energized gas in the chamber 36a, and may be applied by a method which provides a strong bond between the metal coating 304 and ceramic form 302. For example, the coating may be applied by one or more of a chemical or physical deposition process, or by a flame spraying or thermal spraying method, such as a twin wire arc method, plasma arc method, or oxy-fuel gas flame. A thickness of the metal coating 304 suitable to reduce erosion in the process chamber 36a may be a thickness of, for example, at least about 0.05 mm, and even may be less than about 0.5 mm.

In one version, the metal coating is applied to the treated surface by a twin wire arc thermal spraying process, as for example, described in U.S. Pat. No. 6,227,435 B1, issued on May 8th, 2001 to Lazarz et al, and U.S. Pat. No. 5,695,825 issued on Dec. $9^{th}$, 1997 to Scruggs, both of which are incorporated herein by reference in their entireties. In the twin wire arc thermal spraying process, a thermal sprayer (not shown) comprises two consumable electrodes that are shaped and angled to allow an electric arc to form therebetween. For example, the consumable electrodes may comprise twin wires formed from the metal to be coated on the surface 306, which are angled towards each other to allow an electric discharge to form near the closest point. An electric arc discharge is generated between the consumable electrodes when a voltage is applied to the consumable electrodes as a carrier gas, such as one or more of air, nitrogen or argon, is flowed between the electrodes. Arcing between the electrodes atomizes and at least partially liquifies the metal on the electrodes, and carrier gas energized by the arcing electrodes propels the molten particles out of the thermal sprayer and towards the treated surface 306 of the ceramic form 302. The molten particles impinge on the surface 306 of the ceramic form 302, where they cool and condense to form a conformal coating 304. When twin wires are used, the wires may be continuously fed into the thermal sprayer to provide a continuous supply of the metal material.

Operating parameters during thermal spraying are selected to be suitable to adjust the characteristics of the coating material application, such as the temperature and velocity of the coating material as it traverses the path from the thermal sprayer to the ceramic form surface 306. For example, gas flows, power levels, powder feed rate, carrier gas flow, standoff distance from the thermal sprayer to the surface, and the angle of deposition of the coating material relative to the surface 306 can be adapted to improve the application of the coating material and the subsequent adherence of the coating 304 to surface 306. For example, the voltage between the consumable electrodes may be selected to be from about 10 Volts to about 50 Volts, such as about 30 Volts. Additionally, the current that flows between the consumable electrodes may be selected to be from about 100 Amps to about 1000 Amps, such as about 300 Amps. The power level of the plasma torch is usually in the range of from about 6 to about 80 kiloWatts, such as about 10 kilowatts.

The standoff distance and angle of deposition can be selected to adjust the deposition characteristics of the coating material on the surface. For example, the standoff distance and angle of deposition can be adjusted to modify the pattern in which the molten coating material splatters upon impacting the surface 306, to form for example, "pancake" and "lamella" patterns. The standoff distance and angle of deposition can also be adjusted to modify the phase, velocity, or droplet size of the coating material when it impacts the surface 306. In one embodiment, the standoff distance between the thermal sprayer and the surface is from about 5 inches, and the angle of deposition of the coating material onto the surface 306 is about 90 degrees.

The velocity of the coating material can be adjusted to suitably deposit the coating material on the surface 306. In one embodiment, the velocity of the powdered coating material is from about 100 to about 300 meters/second. Also, the thermal sprayer may be adapted so that the temperature of the coating material is at least about melting temperature when the coating material impacts the surface 306. Temperatures above the melting point can yield a coating of high density and bonding strength. For example, the temperature of the energized carrier gas about the electric discharge may exceed 5000° C. However, the temperature of the energized carrier gas about the electric discharge can also be set to be sufficiently low that the coating material remains molten for a period of time upon impact with the surface 306. For example, an appropriate period of time may be at least about a few seconds.

A component 300 that has been treated and coated according to the present process shows substantially improved bonding between the metal coating 302 and the underlying ceramic form 302. For example a component 300 treated and coated according to the present process provides enhanced performance in a sputtering deposition chamber 36a, where sputtered material formed in the chamber 36a can accumulate on exposed surfaces 308 of the component 300 to a thickness of at least about 0.2 mm, and even up to about 1 mm, or even up to about 1.5 mm, substantially without causing spalling of the metal coating 304 from the component 300.

In one version, the treatment and coating process described above may be preformed to fabricate a coated component 300 for use in the chamber 36a. For example, to fabricate the component 300, the ceramic form 302 may be prepared from a mixture of ceramic powders and a binder, which may be an organic binder material. The ceramic powder and binder may be shaped in a mold into a suitable ceramic preform by, for example, slip casting, or may be formed by ram pressing or isostatic pressing, or by tape casting. For example, in one version, the ceramic powder and binder may be shaped into the form of a deposition ring or cover ring for use in a deposition chamber 36a. Thereafter, the shaped preform is sintered to form a hardened ceramic material comprising the ceramic form 302. Suitable connector or other structures may be formed in the shaped preform prior to sintering. The sintered ceramic form 302 may also be ground to a desired thickness and other structures may also be drilled or machined into the porous ceramic material. Once a ceramic form 302 having the desired shape is formed, the treatment process described above may be performed to treat the surface of the ceramic form 302 by bead blasting and dipping in solution to prepare a surface 306 of the ceramic form 302 for bonding to the metal coating 304. Thereafter, the metal coating 304 is applied by, for example, thermal spraying a metal material onto the surface 306.

In another version, the treatment and coating process may be performed to refurbish a component 300 that has been used in a substrate processing chamber 36a, for example to refurbish a component 300 that has been damaged by exposure to an energized gas in the chamber 36a. In this version, the component 300 comprising the ceramic form 302 and damaged metal coating 304 is refurbished and treated by removing the metal coating 304 and treating and coating the underlying surface 306. The metal coating 304 may be removed, for example, in a bead blasting process, such as the process described above, or by another metal removal method, such as an etching process. Once the metal coating 304 has been removed, the underlying surface 306 is bead blasted and dipped in a treatment solution according to the present process. Finally, the surface 306 is re-coated with the metal coating 302, for example by the thermal coating process.

FIG. 2 is a flow chart demonstrating the treatment and coating process according to the present invention. As shown in the flow chart, the process generally comprises: (i) bead blasting a component 300 to provide a surface roughness having a roughness average of less than about 150 microinches; (ii) dipping the ceramic form into a solution having a concentration that is sufficiently low to reduce etching of grain boundary regions of the ceramic form; and (iii) forming a metal coating over at least a portion of the ceramic form.

Figure 3:
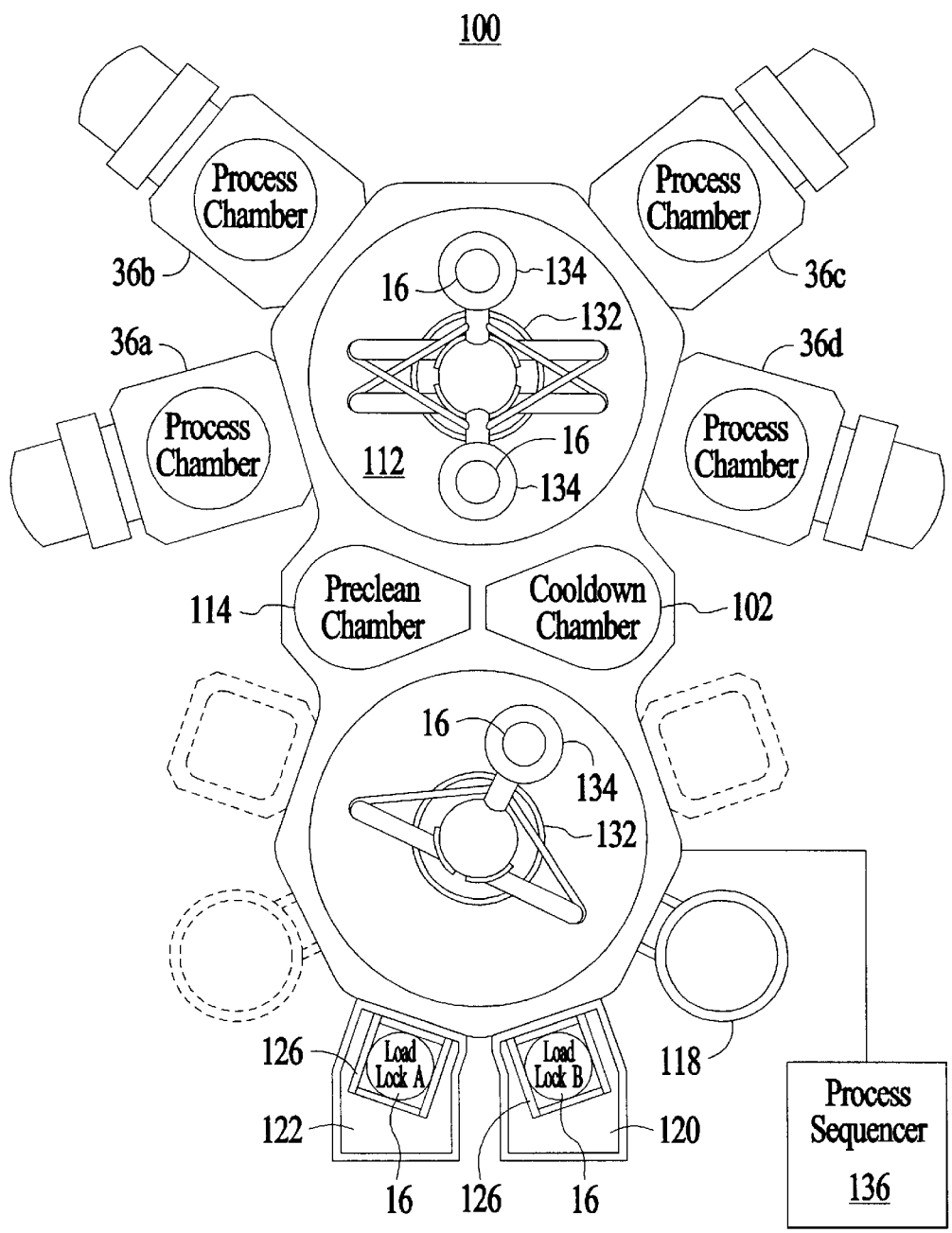
FIG. 3 is a schematic sectional top view of an embodiment of an apparatus comprising a multi-chamber platform having a number of interconnected PVD chambers mounted on the platform.

The treated and coated component 300 may be used in a process chamber 36a that may be part of a multi-chamber platform 100, as shown in FIG. 3. The multi-chamber platform 100 may be, for example, an "ENDURA" system commercially available from Applied Materials, Santa Clara, Calif. The particular embodiment of the platform 100 shown herein, which is suitable for processing a planar silicon wafer substrate 16, is provided only to illustrate the invention, and should not be used to limit the scope of the invention. The multi-chamber platform 100 typically comprises a cluster of interconnected chambers 36a–d, 114, 102, 118 and a substrate transport comprising robot arm mechanisms 132 to transfer substrates 16 between the chambers 36a–d, 114, 102, 118. The robot arm mechanisms 132 comprise robot arms having blades 134 that support and carry the substrates 16. Load-lock chambers 120, 122 receive transport cassettes 126 containing the substrates 16. A substrate orienting and degassing chamber 118 is provided to orient the substrate 16 in preparation for processing, and to degas the substrate 16 to remove contaminants from the substrate 16 that could otherwise disrupt the high-vacuum environment in the process chambers 36a–d. A pre-clean chamber 114 may be used to clean the substrates 16 prior to any deposition step, and a cool down chamber 102 may be used to cool the substrates 16. A process sequencer 136 is provided to control the robot arm mechanisms 132, such as to order the sequence in which the robot arm mechanism 132 transfers the substrates 16 to and from the various chambers 36a–d, 114,102,118. Typically, the process sequencer 136 controls the robot arm mechanisms 132 to transfer a substrate 16 from one of the load lock chambers 120,122 to the orienting and degassing chamber 118, then to the preclean chamber 114, then to one or more of the process chambers 36 a-d, and afterwards to the cool down chamber 102.

Figure 4:
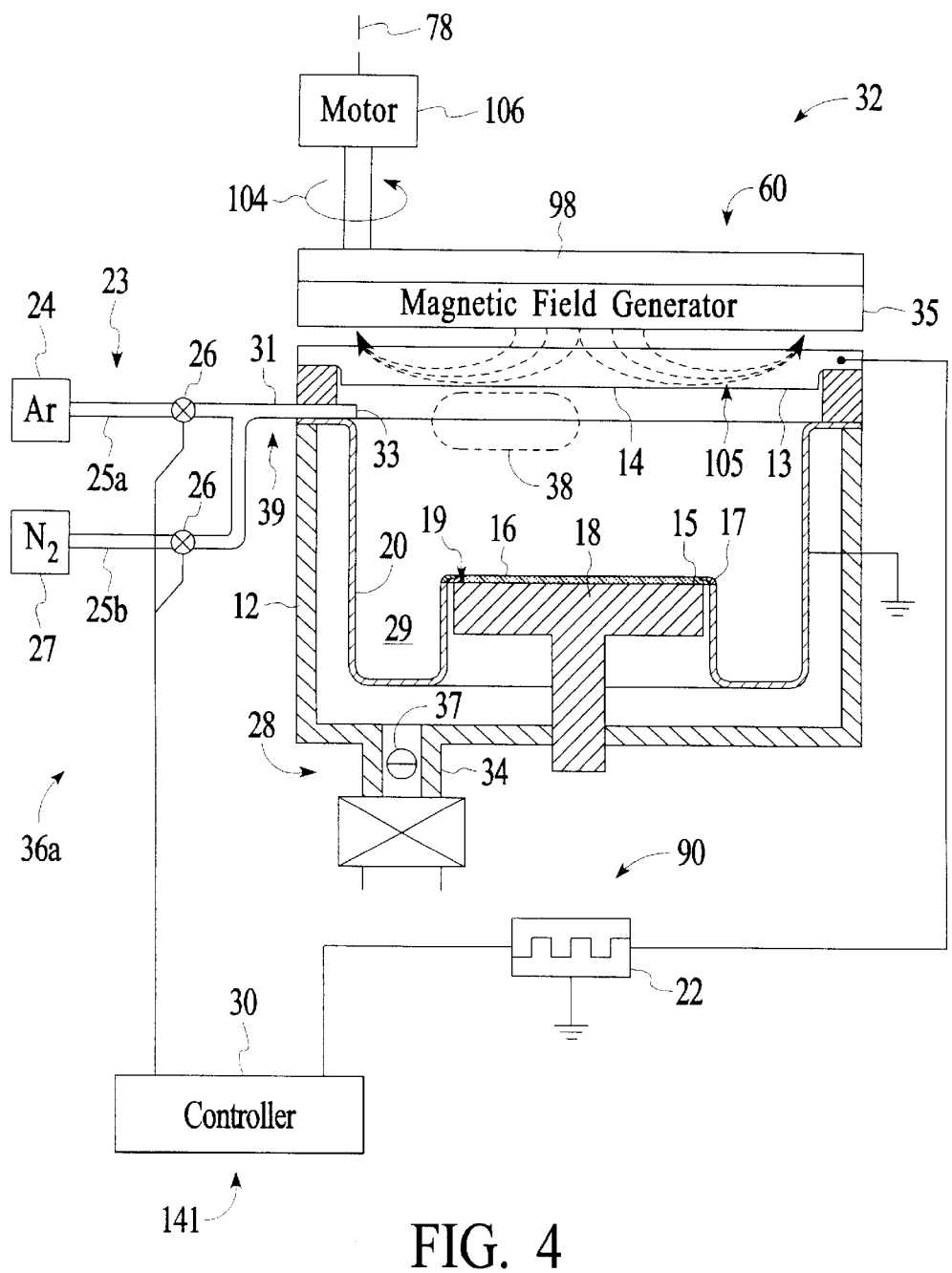
FIG. 4 is a schematic sectional side view of an embodiment of a PVD chamber suitable.

The multi-chamber platform 100 has at least one PVD chamber 36a, as for example illustrated in FIG. 4, to sputter deposit a layer such as one or more of tantalum, tantalum nitride, or copper, on the substrate 16. A substrate support 18 is provided for supporting the substrate 16 in the PVD chamber 36a. The substrate 16 is introduced into the chamber 36a through a substrate loading inlet (not shown) in a sidewall 45 of the chamber 36a and placed on the support 18. The support 18 can be lifted or lowered by support lift bellows (not shown) and a lift finger assembly (also not shown) can be used to lift and lower the substrate 16 onto the support 18 during transport of the substrate 16 into and out of the chamber 36a.

The support 18 may comprise one or more rings, such as a deposition ring 15 and a cover ring 17, that cover at least a portion of the upper surface 19 of the support 18 to inhibit erosion of the support 18. For example, the deposition ring 15 and cover ring 17 may cover at least a portion of an electrostatic chuck (not shown) on the support 18 to reduce exposure of the electrostatic chuck to energized gas in the chamber 36a and to reduce the deposition of particles onto the electrostatic chuck. In one version, the deposition ring 15 at least partially surrounds the substrate 16 to protect portions of the support 18 not covered by the substrate 16. The cover ring 17 may encircle at least a portion of the deposition ring 15, and help to reduce the deposition of particles onto both the deposition ring 15 and underlying support 18. According to one aspect of the invention, the deposition ring 15 and cover ring 17 may be treated and coated according to the present process. The strongly bonded metal coating 304 provided by the present process allows the rings 15,17 to accommodate a greater amount of deposition without excessive thermal expansion stresses or de-lamination of the coating 304. Thus, the deposition ring 15 and cover ring 17 treated and coated according to the present process may have enhanced erosion resistance and provide better erosion protection to the underlying substrate support 18.

A sputtering gas supply 23 introduces sputtering gas into the chamber 36a to maintain the sputtering gas at a sub atmospheric pressure in the process zone. The sputtering gas is introduced into the chamber 36a through a gas inlet 33 that is connected via the gas inputs 25a,b to one or more gas sources 24, 27, respectively. One or more mass flow controllers 26 are used to control the flow rate of the individual gases—which may be premixed in a mixing manifold 31 prior to their introduction into the chamber 36a or which may be separately introduced into the chamber 36a. The sputtering gas typically includes a non-reactive gas, such as argon or xenon, that when energized into a plasma, energetically impinges upon and bombards the target 14 to sputter material, such as copper, tantalum, or tantalum nitride, off from the target 14. The sputtering gas may also comprise a reactive gas, such as nitrogen. Also, other compositions of sputtering gas that include other reactive gases or other types of non-reactive gases, may be used as would be apparent to one of ordinary skill in the art.

An exhaust system 28 controls the pressure of the sputtering gas in the chamber 36a and exhausts excess gas and by-product gases from the chamber 36a. The exhaust system 28 comprises an exhaust port 29 in the chamber 36a that is connected to an exhaust line 34 that leads to one or more exhaust pumps 29. A throttle valve 37 in the exhaust line 34 may be used to control the pressure of the sputtering gas in the chamber 36a. Typically, the pressure of the sputtering gas in the chamber 36a is set to sub-atmospheric levels, for example, from about 2 to about 10 mTorr.

The PVD chamber 36a further comprises a sputtering target 14 comprising titanium, facing the substrate 16. A collimator (not shown) may be mounted between the target 14 and the substrate support 18 if desired. The PVD chamber 36a may also have a shield 20 to protect a wall 12 of the chamber 36a from sputtered material, and typically, to also serve as an anode grounding plane. The shield 20 is electrically floating or grounded. The target 14 is electrically isolated from the chamber 36a and is connected to a voltage source, such as a DC power source 22, but which may also be other types of voltage sources such as an RF power source. In one version, the DC power source 22, target 14, and shield 20 operate as a gas energizer 90 that is capable of energizing the sputtering gas to sputter material from the plasma. The DC power source 22 applies a DC voltage, for example as a DC voltage pulse, to the target 14 relative to the shield 20. The electric field generated in the chamber 36a from the voltage applied to the sputtering target 14 energizes the sputtering gas to form a plasma that sputters material from the target 14. The material sputtered form the target by the plasma is deposited on the substrate 16 and may react with gas components of the plasma to form a deposition layer on the substrate 16.

The chamber 36a further comprises a magnetron 32 comprising a magnetic field generator 35 that generates a magnetic field 105 near the target 14 of the chamber 36a to increase an ion density in a high-density plasma region 38 adjacent to the target 14 to improve the sputtering of the target material. In addition, an improved magnetron 32 may be used to allow sustained self-sputtering of copper or sputtering of aluminum, titanium, or other metals; while minimizing the need for non-reactive gases for target bombardment purposes, as for example, described in U.S. Pat. No. 6,183,614 to Fu, entitled "Rotating Sputter Magnetron Assembly"; and U.S. Pat. No. 6,274,008 to Gopalraja et al., entitled "Integrated Process for Copper Via Filling," both of which are incorporated herein by reference in their entirety. The magnetic field 105 extends through the substantially non-magnetic target 14 into the vacuum chamber 36a. In one version, the magnetron 32 generates a semi-toroidal magnetic field at the target 14. In one embodiment, the magnetron 32 extends horizontally from approximately a central point on the target 14 to the edge of a usable area of the target 14. In one version, the magnetron 32 comprises a motor 106 to rotate the magnetron 32 about a rotation axis 78. The motor 106 is typically attached to a magnetic yoke 98 of the magnetron 32 by a shaft 104 that extends along the rotation axis 78."

Figure 5:
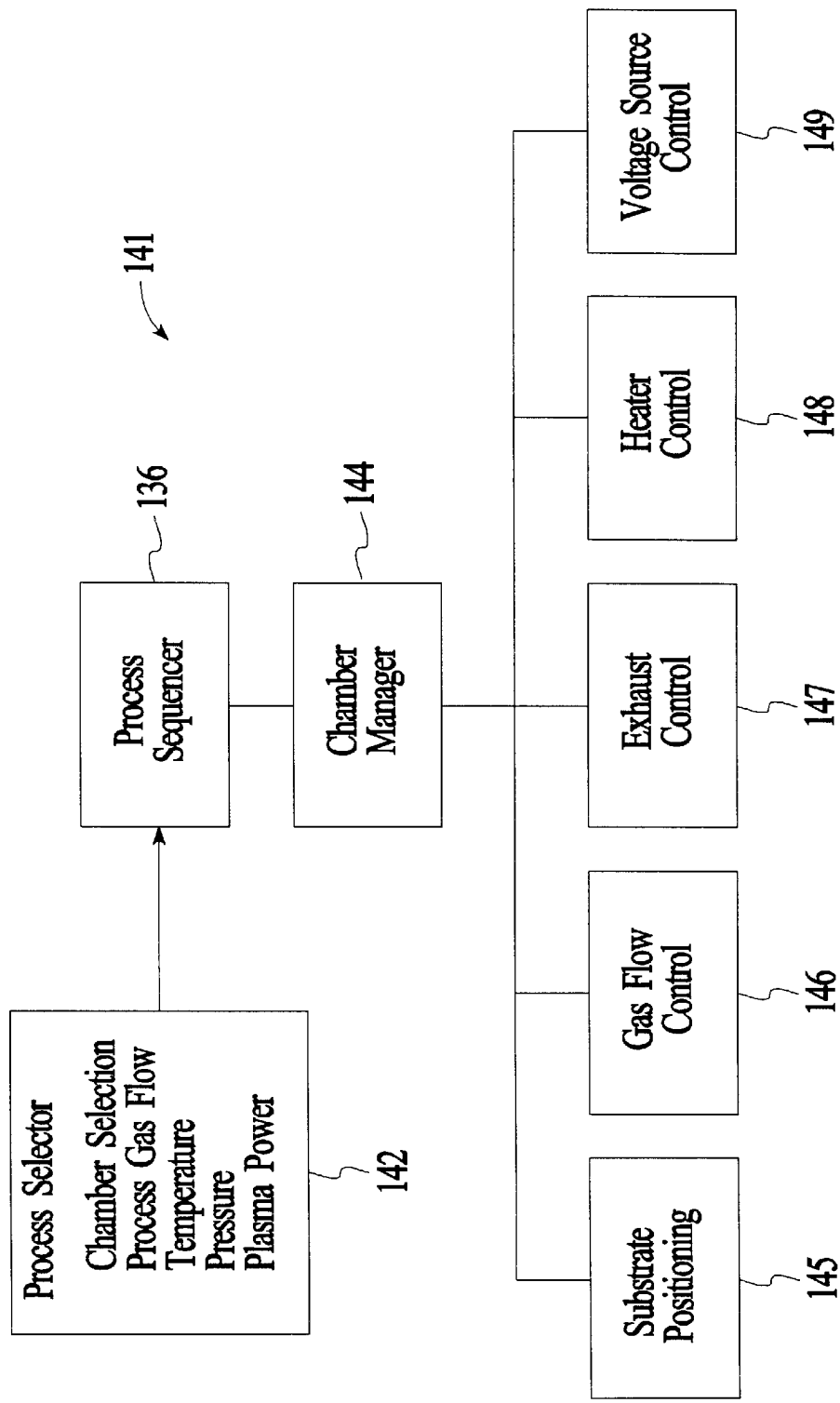
FIG. 5 is a simplified block diagram of a hierarchical control structure of an embodiment of a computer program capable of operating the PVD chamber of FIG. 4.

The PVD process of the present invention may be implemented using a computer program product 141 that includes the process sequencer 136 and that runs on a controller 30, as shown in FIG. 5, comprising a central processing unit (CPU) interconnected to a memory system with peripheral control components, such as for example a 68400 microprocessor, commercially available from Synergy Microsystems, California. The computer program code can be written in any conventional computer readable programming language, such as for example, assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

A user enters a process set and process chamber number into a process selector program code 142. The process sets are predetermined sets of process parameters necessary to carry out specified processes in a specific process chamber, and are identified by predefined set numbers. The process parameters relate to process conditions such as, for example, process gas composition and flow rates, temperature, pressure, gas energizing process conditions such as non-pulsed or pulsed DC power levels and magnetic field power levels, cooling gas pressure, and chamber wall temperature.

The process sequencer 136 comprises program code for accepting the identified process chamber 36 and set of process parameters from the process selector program code 142, and for controlling operation of the various process chambers 36a–d. Multiple users can enter process set numbers and process chamber numbers, or a user can enter multiple process set numbers and process chamber numbers, so the process sequencer 136 operates to schedule the selected processes in the desired sequence. Preferably, the process sequencer 136 includes a program code to perform the steps of (i) monitoring the operation of the process chambers 36a–d to determine if the chambers 36a–d are being used, (ii) determining what processes are being carried out in the chambers 36a–d being used, and (iii) executing the desired process based on availability of a particular process chamber 36 and type of process to be carried out. Conventional methods of monitoring the process chambers 36a–d can be used, such as polling. When scheduling which process is to be executed, the process sequencer 136 can be designed to take into consideration the present condition of the process chamber 36 being used in comparison with the desired process conditions for a selected process, or the "age" of each particular user entered request, or any other relevant factor a system programmer desires to include for determining scheduling priorities.

Once the process sequencer 136 determines which process chamber and process set combination is going to be executed next, the sequencer program code 143 causes execution of the process set by passing the particular process set parameters to a chamber manager program code 144 which controls multiple processing tasks in different process chambers 36a–d according to the process set determined by the process sequencer 136. For example, the chamber manager program code 144 comprises program code for controlling PVD process operations, within the described process chamber 36a. The chamber manager program code 144 also controls execution of various chamber component program codes or program code modules, which control operation of the chamber components 300 necessary to carry out the selected process set. Examples of chamber component program codes are a substrate positioning program code 145, gas flow control program code 146, exhaust control program code 147, heater control program code 148, and voltage source control program code 149. Those having ordinary skill in the art would readily recognize that other chamber control program codes can be included depending on what processes are desired to be performed in the process chamber 36a.

In operation, the chamber manager program code 144 selectively schedules or calls the process component program codes in accordance with the particular process set being executed. The chamber manager program code 144 schedules the process component program codes similarly to how the sequencer program code 143 schedules which process chamber 36a–d and process set is to be executed next. Typically, the chamber manager program code 144 includes steps of monitoring the various chamber components 300, determining which components 300 need to be operated based on the process parameters for the process set to be executed, and causing execution of a chamber component program code responsive to the monitoring and determining steps.

Operation of particular chamber component program codes will now be described. The substrate positioning program code 145 comprises program code for controlling chamber components 300 that are used to transfer a substrate 16 onto the substrate support 18, and optionally, to lift the substrate 16 to a desired height in the chamber 36 to control the spacing between the substrate 16 and a target. When a substrate 16 is transferred into the process chamber 36a, the substrate support 18 is lowered to receive the substrate 16, and thereafter, the support 18 is raised to the desired height in the chamber 36a. The substrate positioning program code 145 controls movement of the support 18 in response to process set parameters related to the support height that are transferred from the chamber manager program code 144.

The gas flow program code 146 is for controlling process gas composition and flow rates. Generally, the gas conduits 34 for each of the process gases, include safety shut-off valves (not shown) that can be used to automatically or manually shut off the flow of process gas into the chamber 36a. When toxic gases are used in the process, the several safety shut-off valves are positioned on each gas conduit 34 in conventional configurations. The gas flow program code 146 controls an open/close position of the safety shut-off valves, and also ramps up/down the mass flow controllers to obtain the desired gas flow rate. The gas flow program code 146 is invoked by the chamber manager program code 144, as are all chamber component program codes, and receives from the chamber manager program code, the process parameters that are related to desired gas flow rates. Typically, the gas flow program code 146 operates by repeatedly reading the necessary mass flow controllers, comparing the readings to the desired flow rates received from the chamber manager program code 144, and adjusting the flow rates as necessary. Furthermore, the gas flow program code 146 includes steps for monitoring the gas flow rates for unsafe rates, and activating the safety shut-off valves when an unsafe condition is detected. In one version, the gas flow program code 146 operates the mass flow controllers to control the gas flow rates to provide a sputtering gas comprising first volumetric flow ratio of oxygen-containing gas to argon for a first time period, and a second volumetric flow ratio of oxygen-containing gas to argon for a second time period.

When the exhaust control program code 147 is invoked, a desired pressure level is received as a parameter from the chamber manager program code 144. The exhaust control program code 147 operates to measure the pressure in the chamber 36a by reading one or more conventional pressure nanometers (not shown) connected to the chamber 36a, compare the measure value(s) to the target pressure, obtain PID (proportional, integral, and differential) values from a stored pressure table corresponding to the target pressure, and adjust a throttle valve 37 of the exhaust 28 according to the PID values obtained from the pressure table. Alternatively, the pressure in the chamber 36a may be adjusted by regulating the opening size of the throttle valve 37 in the exhaust conduit 34 of the exhaust system 28.

The optional heater control program code 148 comprises program code for controlling the temperature of an optional heater (not shown) that may be used to heat the substrate 16. The heater control program code 148 measures temperature by measuring voltage output of a thermocouple (not shown) located in the support 18, compares the measured temperature to the set-point temperature, and increases or decreases current applied to the heater to obtain the desired ramp rate or set-point temperature. The temperature is obtained from the measured voltage by looking up the corresponding temperature in a stored conversion table, or by calculating the temperature using a fourth order polynomial. When radiant lamps are used as the heater, the heater control program code 148 gradually controls a ramp up/down of current applied to the lamp that increases the life and reliability of the lamp. Additionally, a built-in fail-safe mode can be included to detect process safety compliance, and to shut down operation of the heater if the process chamber 36a is not properly set up.

The voltage source program code 149 comprises program code for controlling a voltage source, such as the DC voltage source, to energize the sputtering gas in the chamber 36a to sputter material from the target 14. For example, the program code 149 may set pulsed DC voltage levels applied to the target 14 and may also set the electrical state of the sidewalls 20 in the chamber 36a. Similarly to the previously described chamber component program codes, the program code 149 is invoked by the chamber manager program code 144. In operation, the program code 149 includes steps for reading both "forward" power applied to the target 14, and "reflected" power flowing through the chamber 36a. An excessively high reflected power reading indicates that the plasma has not been ignited, and the program code 149 restarts or shuts down the process. The read power levels are compared against target levels, and the current is adjusted to control the plasma.

EXAMPLE

The following example demonstrates the enhanced metal coating adhesion provided by the present treating and coating process over conventional processes.

In the example, a ceramic form 302 comprising aluminum oxide was treated and then coated with a metal coating 304 comprising aluminum according to the present invention. In a first treatment step, the surface of the aluminum oxide ceramic form 302 was bead blasted to a roughness average of 100 microinches. In a second treatment step, the surface of the aluminum oxide ceramic form was dipped in a solution comprising hydrochloric acid in a concentration of 5 volume percent for a duration of 1 minute. The aluminum metal coating 304 was applied to the treated surface 306 by the twin arc thermal spraying method, using twin aluminum wires as the consumable electrodes. The aluminum material was sprayed onto the surface 306 to form a coating 304 comprising a thickness of 0.25 mm.

The bond strength between the aluminum metal coating 304 and the aluminum oxide ceramic form 302 was determined and compared to the bond strength of components 300 prepared according to conventional processes. The bond strength was determined according to the ASTM C633 testing standard. Using the ASTM testing standard, the surface 308 of the metal coating 304 is bonded to a fixture with an adhesive. A tensile load is applied normal to the plane of the coating 304 via the fixture to determine the strength of the coating bond. The degree of adhesion or cohesive strength may be determined according to the following equation:

Adhesion or cohesive strength=maximum load/cross-sectional area.     1)

Figure 6:
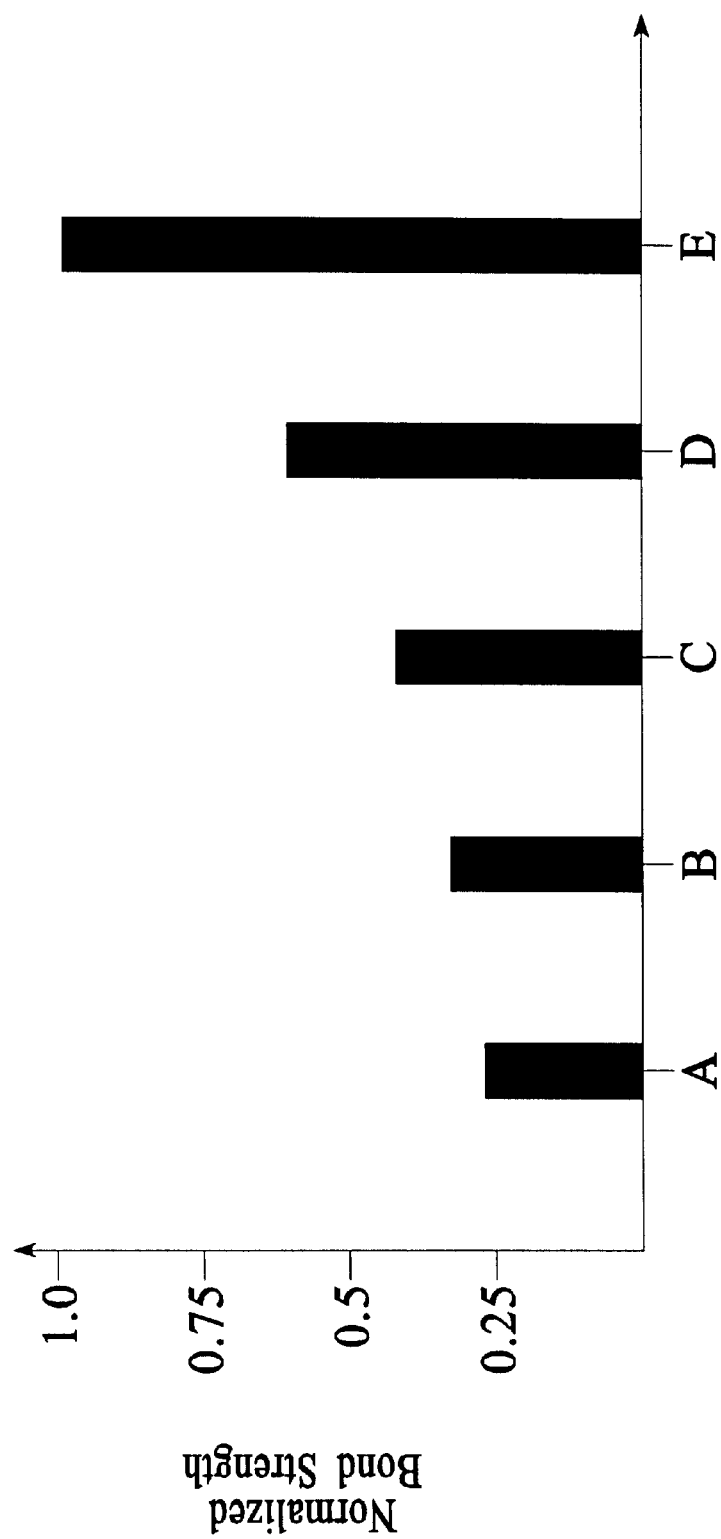
FIG. 6 is a bar graph comparing the bond strength of metal coatings on components fabricated by different processes.

FIG. 6 demonstrates the normalized bond strength measured for a component 300 treated and coated according to the present process, labeled component E, in comparison to components 300 that were treated and coated according to a conventional process, labeled components A–D. As shown in the figure, the present process provided a component 300 having a substantially stronger bond between the coating 304 and ceramic preform 302. Component D shows a bond strength less than 75 percent as strong as the component 300 of the present process, while components A, B, and C show a bond strength that is less than half that of component E.

The measured bond strengths also allow estimations of the part life of the components 300, defined as the number of substrates 16 that could be processed in the chamber 36a before removal or refurbishing of the component 300 is required, which further confirm the enhanced performance of the component 300 treated and coated according to the present process. Components A and B are estimated to have a part life of about 3000 substrates, component C is estimated to have a part life of 2000–4500 substrates, and component D is estimated to have a part life of 5200 to 6500 wafers. In comparison, component E prepared according to the present process is estimated to have a substantially increased part life of at least about 7500 wafers.

Thus, by preparing a component 300 by treating the ceramic form surface 306 according to the present process, enhanced bonding of the metal coating 304 to the surface 306 is provided, thereby increasing the strength of the metal coating-ceramic form bond and decreasing the susceptibility of the component 300 to de-lamination or spalling of the metal coating 304 from the ceramic form 302. A component 300 treated and coated according to the present invention provides improved resistance to erosion in a substrate processing environment and an extended part life, thereby increasing the efficiency and quality of the processed substrates 16.

Although exemplary embodiments of the present invention are shown and described, those of ordinary skill in the art may devise other embodiments which incorporate the present invention, and which are also within the scope of the present invention. For example, other treatment agents other than those specifically mentioned may be used. Also, the ceramic form 302 and metal coating 304 may comprise compositions other than those specifically mentioned may be used, as would be apparent to those of ordinary skill in the art. Furthermore, the terms below, above, bottom, top, up, down, first and second and other relative or positional terms are shown with respect to the exemplary embodiments in the figures and are interchangeable. Therefore, the appended claims should not be limited to the descriptions of the preferred versions, materials, or spatial arrangements described herein to illustrate the invention.

What is claimed is:

1. A method of fabricating a component for a process chamber, the component comprising a ceramic form having a surface with grains and grain boundary regions, and the method comprising:
   (a) bead blasting the surface of the component to provide a roughened surface having a roughness average of less than about 150 microinches, thereby forming surface debris and contaminants on the roughened surface;
   (b) dipping the roughened surface of the component into an solution having a concentration of acid or base that is (i) sufficiently high to clean surface debris and contaminants off the roughened surface, and (ii) sufficiently low to reduce etching damage of grain boundary regions of the ceramic form; and
   (c) forming a metal coating over at least a portion of the ceramic form.

2. A method according to claim 1 comprising performing (b) after (a).

3. A method according to claim 1 wherein the solution comprises HF in a concentration of less than about 10 volume percent.

4. A method according to claim 1 wherein the solution comprises less than about 20 volume percent of one or more of KOH, HCl or $HNO_3$.

5. A method according to claim 1 wherein the solution comprises less than about 20 volume percent of diethylene glycol monobutyl ether.

6. A method according to claim 1 wherein the ceramic form comprises aluminum oxide and the metal coating comprises aluminum.

7. A method according to claim 1 wherein the component is a deposition ring or cover ring.

8. A method according to claim 1 comprising fabricating a component having resistance to erosion in an energized gas.

9. A method according to claim 1 wherein the component comprises a deposition ring or a cover ring.

10. A method of fabricating a component for a process chamber, the component comprising a ceramic form having aluminum oxide grains and grain boundary regions, and the method comprising:

(a) bead blasting the component to provide a surface roughness having a roughness average of less than about 150 microinches;

(b) dipping the component into a solution comprising an acidic agent, the acidic agent comprising one or more of HF, HCl, and HNO$_3$, wherein the acidic agent is in a concentration of less than about 10 volume percent; and (c) forming an aluminum coating over at least a portion of the component by a twin-wire thermal spraying process.

11. A method according to claim 10 comprising performing (b) after (a).

12. A method according to claim 10 wherein the acidic agent consists essentially of HF.

13. A method according to claim 10 comprising fabricating a component having resistance to erosion in an energized gas.

14. A method of forming a component for a process chamber, the component comprising a ceramic form having aluminum oxide grains and grain boundary regions, and the method comprising:

(a) bead blasting the component to provide a surface roughness having a roughness average of less than about 150 microinches;

(b) dipping the component into a solution comprising one or more of KOH or diethylene glycol monobutyl ether in concentration of less than about 20 volume percent; and (c) forming an aluminum coating over at least a portion of the ceramic form by a twin wire thermal spraying process.

15. A method according to claim 14 comprising performing (b) after (a).

16. A method according to claim 14 comprising fabricating a component having resistance to erosion in an energized gas.

* * * * *